United States Patent [19]

Furuta

[11] 4,334,149
[45] Jun. 8, 1982

[54] TAPE RECORDER WITH DISPLAY SHOWING TAPE TRAVEL DIRECTION

[75] Inventor: Kenji Furuta, Hachioji, Japan

[73] Assignee: Olympus Optical Company Limited, Hachioji, Japan

[21] Appl. No.: 7,808

[22] Filed: Jan. 30, 1979

[30] Foreign Application Priority Data

Feb. 1, 1978 [JP] Japan .............................. 53/11168[U]

[51] Int. Cl.³ .............................................. G06M 3/14
[52] U.S. Cl. .......................... 235/92 MP; 235/92 DN; 235/92 EV
[58] Field of Search ....... 235/92 DN, 92 EV, 92 MP; 364/705; 360/137

[56] References Cited

U.S. PATENT DOCUMENTS

| 3,681,575 | 8/1972 | Wolfe | 235/92 MP |
| 3,986,004 | 10/1976 | Whitney | 235/92 DN |
| 4,021,828 | 5/1977 | Iura et al. | 235/92 MP |
| 4,140,896 | 2/1979 | Robertson | 235/92 MP |
| 4,167,787 | 9/1979 | Satoh et al. | 364/705 |
| 4,189,636 | 2/1980 | Satoh | 235/92 MP |
| 4,237,373 | 12/1980 | Okatani et al. | 235/92 MP |

Primary Examiner—Joseph M. Thesz
Attorney, Agent, or Firm—Toren, McGeady & Stanger

[57] ABSTRACT

In the disclosed tape recorder, wherein separate sources of electric power actuate the tape drive and energize a display for showing the running direction of a tape, the display showing the running direction of the tape is disabled unless the source that energizes the drive is effective.

14 Claims, 1 Drawing Figure

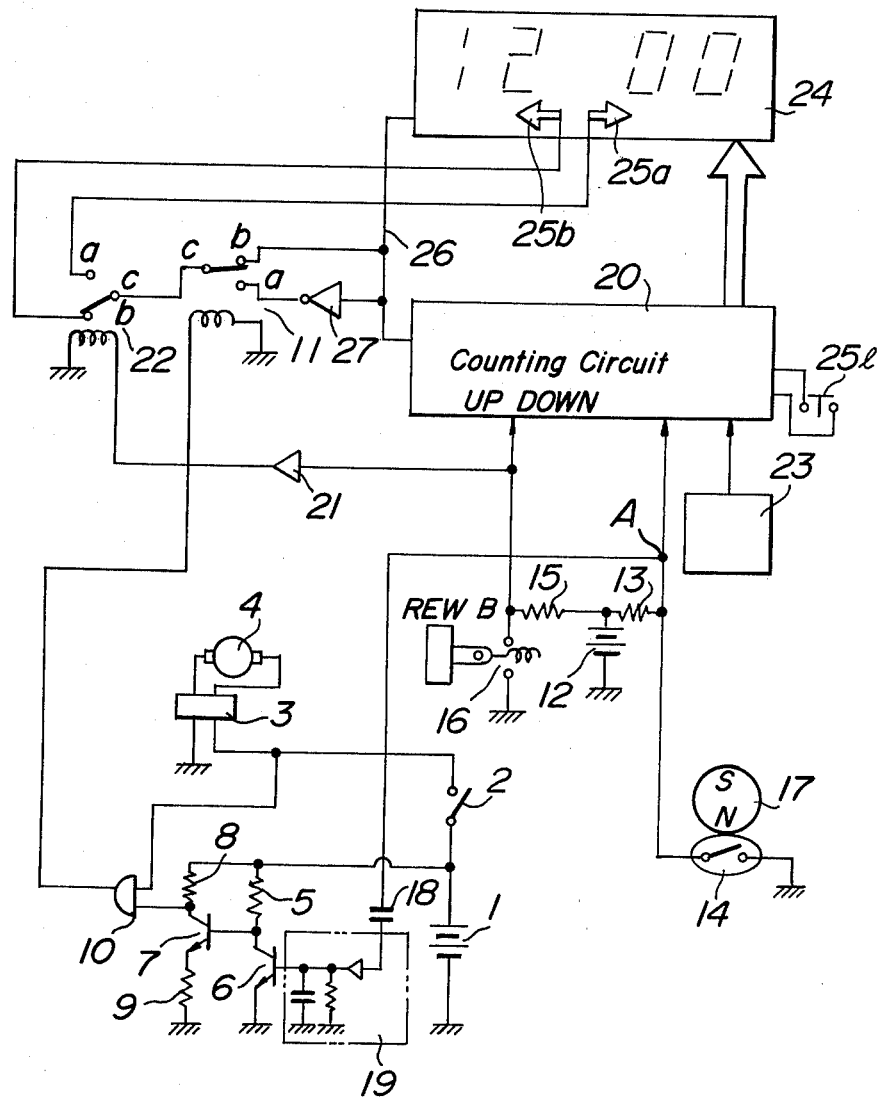

4,334,149

TAPE RECORDER WITH DISPLAY SHOWING TAPE TRAVEL DIRECTION

BACKGROUND OF THE INVENTION

The present invention relates to a tape recorder provided with functions such as a clock or the like that also serves as a tape counter.

Consideration has been given to incorporating devices such as a clock into a superminiature tape recorder.

In general, however, the cell or battery life of a tape recorder is about ten and several hours and the cell voltage thereof varies with the fluctuation of the output, so that in the tape recorder supplemented with the above described multi-function devices, the counting circuit and a display portion assembled with a clock function are driven by an electric power source different from the electric power source of the tape recorder. Therefore, in such tape recorder, even if the tape recorder function is stopped, time of the clock or the like is continuously displayed.

In a tape recorder which can always actuate its display portion, however, if the display of the tape running direction is added to the display portion, even when the tape recorder is out of operation, the tape running direction is displayed and a separate electric power source is uselessly wasted.

SUMMARY OF THE INVENTION

An object of the present invention is to eliminate the above described disadvantages.

Another object of the present invention is to provide an economically advantageous tape recorder by displaying the tape running direction only when a tape runs so as to prevent unnecessary power waste of the separate power source.

According to the present invention, a tape recorder comprises an electric power source in the tape recorder section, a counting circuit having a tape counter, a clock function and the like, and an electric power source for the tape counter having a display portion in the running direction of a tape and a display device such as a clock or the like, the display portion in the running direction of the tape displaying upon condition of a signal for driving a motor on the tape recorder section. The display portion in the running direction of the tape becomes displayed upon condition of an output in response to the tape run in addition to the signal for driving the motor on the tape recorder side.

BRIEF DESCRIPTION OF THE DRAWING

The single FIGURE is a circuit diagram showing one embodiment of a tape recorder according to the present invention.

DESCRIPTION OF THE PREFERRED EMBODIMENT

Referring now to the drawing one embodiment of a tape recorder according to the present invention will be described. In the drawing, a cell source 1 is connected to a motor amplifier 3 through a switch 2 interlocked with a PLAY button of the tape recorder. To this motor amplifier 3 is connected a motor 4 for driving a tape, and the motor 4 drives a capstan shaft or the like (not shown).

The positive terminal of the source 1 is connected to a transistor 6 through a resistor 5. The transistor 6 has a grounded emitter.

Further, the collector of the transistor 6 is connected to a base of a transistor 7. The transistor 7 has a collector connected to a positive terminal of the source 1 through a resistor 8 and an emitter grounded through a resistor 9.

To the collector of the transistor 7 is connected one input terminal of an AND circuit 10. The AND circuit 10 has another input terminal connected to a junction point of the switch 2 and the motor amplifier 3. Further, the output terminal of the AND circuit 10 is connected to a coil of a lead relay 11.

Another cell power source different from the power source 1 has its positive terminal grounded through a resistor 13 and a lead switch 14 and is further grounded through a resistor 15 and a REW switch 16. The lead switch 14 is switched by a permanent magnet 17 rotated for instance by a tape reel (not shown) to generate an output corresponding to tape travel.

A junction point of the resistor 13 and the lead switch 14 is connected to a base of the transistor 6 through a capacitor 18 and a rectifying circuit 19, and further connected to a counter terminal of a counting circuit 20, and a junction point B of the resistor 15 and the switch 16 is connected to a coil of a lead relay 22 through an amplifier 21 and further connected to an UP-DOWN switching terminal of the counting circuit 20.

The counting circuit 20 has a tape counter function, a clock function and another function for driving a display portion which will be explained later on. Among these functions, the counter function is to count the pulse output generated by switching of the lead switch 14 as an indication of the amount of tape used, and to switch the counting UP and DOWN, and the clock function is to continuously count time by dividing a basic frequency of an oscillation circuit 23.

The counting circuit 20 is connected to a liquid crystal display device 24. The display device 24 selectively displays a tape count or the clock output of the counting circuit 20 in response to a display switch 25. The display device 24 is provided with tape running direction display portions or arrows 25a, 25b. In this case, the display portion 25a displays a count-up while the display portion 25b displays a count-down.

A common wire 26 connected to a common electrode side of the liquid crystal display device 24 is connected to a normally opened fixed contact piece or member a of the lead relay 11 through an inverter 27 and further connected to a normally closed fixed contact piece or member b. A movable contact piece c of the lead relay 11 is connected to a movable contact piece c of the lead relay 22. The lead relay 22 connects the normally opened fixed contact piece a to the tape running direction display portion 25a and further connects the normally closed fixed contact piece b to the tape running direction display portion 25b.

In operation, when the switch 2 is turned on, the motor 4 is driven by the signal for driving the motor and the tape recorder is set to PLAY, if the lead switch 14 is switched as the tape runs, a potential of the source 12 intermittently appears at a junction point A of the lead switch 14. The potential is applied to the base of the transistor 6 through the capacitor 18 and the rectifying circuit 19 so as to turn the transistor 6 ON. When the transistor 6 is turned ON, the transistor 7 is turned OFF, thereby making one input terminal of the AND circuit 10 (H) or high. In this case, since the other input terminal is made high by the switch 2, both the input terminals become high and generate a high output. This energizes the coil of the lead relay 11 and switches the movable contact piece c to the fixed contact point a.

In this state, if the REW switch 16 is open, the coil of the lead relay 22 is energized through the amplifier 21 by means of the source 12 and the movable contact piece c is switched to the side of the fixed contact piece a. As a result, a signal of the common wire 26 is applied to the tape running direction display portion 25a through the inverter 27 as a reverse phase signal, so that the count-up is displayed.

In this case, it is a matter of course that the count function of the counting circuit 20 counts up the pulse output generated by switching of the lead switch 14 as a tape travel amount and count-displays on the display device 24.

In this state, if the REW switch 16 is closed, the coil of the lead relay 22 is deenergized, and the movable contact c is back to the side of the fixed contact piece b. Therefore, the reverse phase signal through the inverter 27 is given to the tape running direction display portion 25b this time, so that the count-down is displayed.

In this case, the count function of the counting circuit 20 is switched to the count-down, and the display of the display device 24 illustrates a count-down.

Further, if the switching action of the lead switch 14 is stopped by a tape end in this PLAY state, the potential by the source 12 appears constant at the contact point A, so that the base signal to the transistor 6 is cut by the capacitor 18, the transistor 6 turns OFF, and one input terminal of the AND circuit 10 becomes (L) or low. As a result, the output of the AND circuit 10 becomes low so as to deenergize the coil of the lead relay 11 and the movable contact piece c is back to the fixed contact piece b. Therefore, a signal of the common wire 26 is applied to the tape running direction display portion 25a as the same phase signal as it is and its display is prevented.

On the other hand, if the switch 2 of the tape recorder is opened to the STOP position, the other input terminal of the AND circuit 10 becomes (L) low and the output of the AND circuit 10 becomes (L) low, so that all display of the tape running direction display portions 25a, 25b are stopped in the same manner as described above.

With the above construction, it becomes possible to display in accordance with the running direction of the tape only when the tape runs, so that unnecessary waste of another power source for the display device can be prevented as compared with the prior tape recorder which displays the tape running direction even when the tape recorder is not operated. As a result, the tape recorder according to the present invention is economically advantageous from the view point of the cell life.

In addition, the present invention is not limited to the above embodiment but can be modified without departing from the essential feature of the invention. For instance, in the above-described embodiment, the display of the tape running direction display portion is made possible when the signal for driving the motor for driving the tape and the output in accordance with the tape running are simultaneously generated, but only the signal for driving the motor for driving the tape can be made as the display condition of the display portion.

As described above, according to the present invention, the tape running direction is displayed only when the tape runs, so that unnecessary power consumption can be prevented and the economically advantageous tape recorder can be provided.

What is claimed is:

1. A tape recorder, comprising a tape drive, tape counter means for counting tape, a tape direction switch, display means responsive to said tape counter means and said direction switch for displaying values indicative of the tape count when the tape counter means indicates that the tape is running, said display means including direction indicating markers, control means coupled to said tape drive and to said display means as well as said counter means and said direction switch for enabling the display of the markers only in response to both the tape drive and the tape counter being operative and for causing said display means to indicate one of said markers in response to said direction switch.

2. A tape recorder as in claim 1, wherein said control means includes an AND gate coupled to said tape counter means and said tape drive for producing a signal only when said tape drive and said counter means operate simultaneously.

3. A tape recorder as in claim 1, wherein said display means includes means for generating and displaying values respresenting a second function other than a tape recording function when the tape counter indicates that the tape is not running.

4. A tape recorder as in claim 3, wherein said markers are in the shapes of arrows.

5. A tape recorder as in claim 3, wherein said markers are in the shapes of arrows.

6. A tape recorder as in claim 2 wherein said control means includes an AND gate coupled to said tape counter means and said tape drive for producing a signal only when said tape drive and said counter means operate simultaneously.

7. A tape recorder as in claim 6, wherein said counter means includes switch means operable intermittently to indicate movement of the tape, and detecting means for detecting the intermittent operation of the switch means, said detecting means being connected to an input of said AND gate.

8. A tape recorder as in claim 7, wherein said tape drive includes connection means coupleable to a source of power for energization of said tape drive, and wherein said tape counter includes contacting means for connection to a second source for energization of at least a portion of said tape counter.

9. A tape recorder as in claim 3, 4, or 8, wherein said generating and displaying means generates the second function continuously when the tape is running and when the tape is still and when the values are displayed as well as when the values are not displayed.

10. A tape recorder as in claim 6, wherein said generating and displaying means generates the second function continuously when the tape is running and when the tape is still and when the values are displayed as well as when the values are not displayed.

11. A tape recorder as in claim 9, wherein said generating and displaying means includes a clock which performs a clock function.

12. A tape recorder as in claim 10, wherein said generating and displaying means includes a clock which performs a clock function.

13. A tape recorder as in claim 5, wherein said display means includes means for generating and displaying values representing a second function other than a tape recording function when the tape counter indicates that the tape is not running.

14. A tape recorder as in claim 2 or 13, wherein said generating and displaying means generates the second function continuously when the tape is running and when the tape is still and when the values are displayed as well as when the values are not displayed.

* * * * *